United States Patent [19]

Vanstraelen

[11] Patent Number: 5,023,455
[45] Date of Patent: Jun. 11, 1991

[54] RADIATION-SENSITIVE DETECTOR ARRAY AND PRE-AMPLIFICATION READOUT INTEGRATED CIRCUIT

[75] Inventor: Guy F. R. J. Vanstraelen, Leuven, Belgium

[73] Assignee: Interuniversitair Micro-Elektronica Centrum vzw, Belgium

[21] Appl. No.: 357,544

[22] Filed: May 26, 1989

[30] Foreign Application Priority Data

May 31, 1988 [NL] Netherlands .......................... 8801396
Sep. 13, 1988 [NL] Netherlands .......................... 8802252

[51] Int. Cl.$^5$ .............................................. G01J 5/00
[52] U.S. Cl. ........................... 250/370.01; 250/370.02; 250/370.08; 250/370.09; 357/32
[58] Field of Search .............. 250/349, 370.02, 370.14, 250/370.10, 370.08, 370.09, 332; 357/32

[56] References Cited

U.S. PATENT DOCUMENTS

| | | | |
|---|---|---|---|
| 4,176,275 | 11/1979 | Korn et al. ...................... | 250/370.08 |
| 4,382,187 | 5/1983 | Fraleux et al. ........................ | 357/32 |
| 4,395,736 | 7/1983 | Fraleux ................................. | 357/32 |
| 4,583,108 | 4/1986 | Sirieix ................................... | 357/32 |
| 4,589,003 | 5/1986 | Yamada et al. ........................ | 357/32 |
| 4,675,739 | 6/1987 | Catchpole et al. ............. | 250/370.09 |
| 4,680,471 | 7/1987 | Morris et al. ................... | 250/370.14 |
| 4,689,487 | 8/1987 | Nishiki et al. .................. | 250/370.14 |
| 4,857,981 | 8/1989 | Matsumoto et al. .................... | 357/32 |

OTHER PUBLICATIONS

Encyclopedia of Computer Science and Engineering, pp. 998-1002, Ralston; Van Nostrand Reinhold Company 1983.
Integration of Detector Arrays and Readout Electronics on a Single Chip, Bedrich J. Hosticka and Günter Zimmer, IEEE Transactions on Nuclear Science, vol. NS-32, No. 1, Feb. 1985.

Primary Examiner—Edward P. Westin
Assistant Examiner—Kim-Kwok Chu
Attorney, Agent, or Firm—Ostrolenk, Faber, Gerb & Soffen

[57] ABSTRACT

Included in a device for detecting radiation is an array of radiation-sensitive elements having respective outputs and circuitry for reading the outputs of such elements. The array of radiation-sensitive elements is preferably configured as a matrix of rows and columns of radiation-sensitive elements. Circuitry is provided to consecutively activate the columns; and circuitry is provided to generate a trigger signal depending on the occurrence of an amount of radiation above a threshold value. In this way the identity of a row in which an element is activated can be determined.

5 Claims, 3 Drawing Sheets

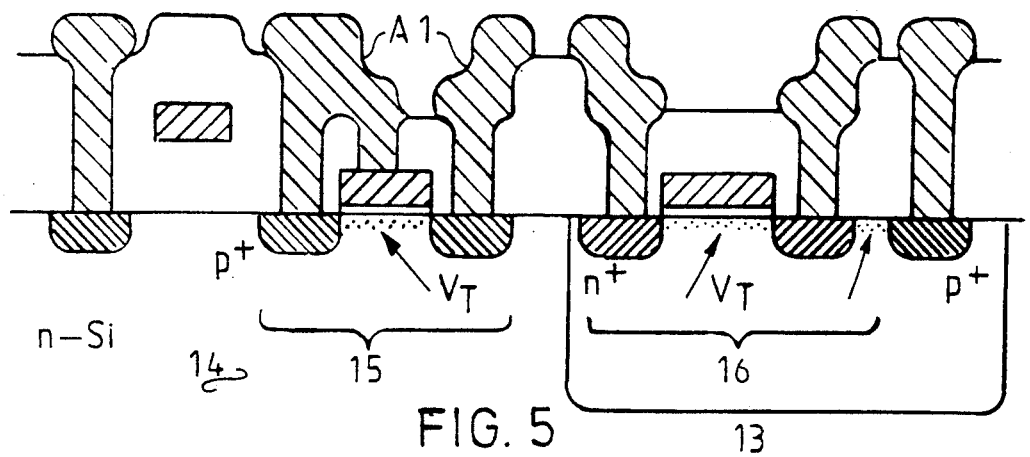
FIG. 5
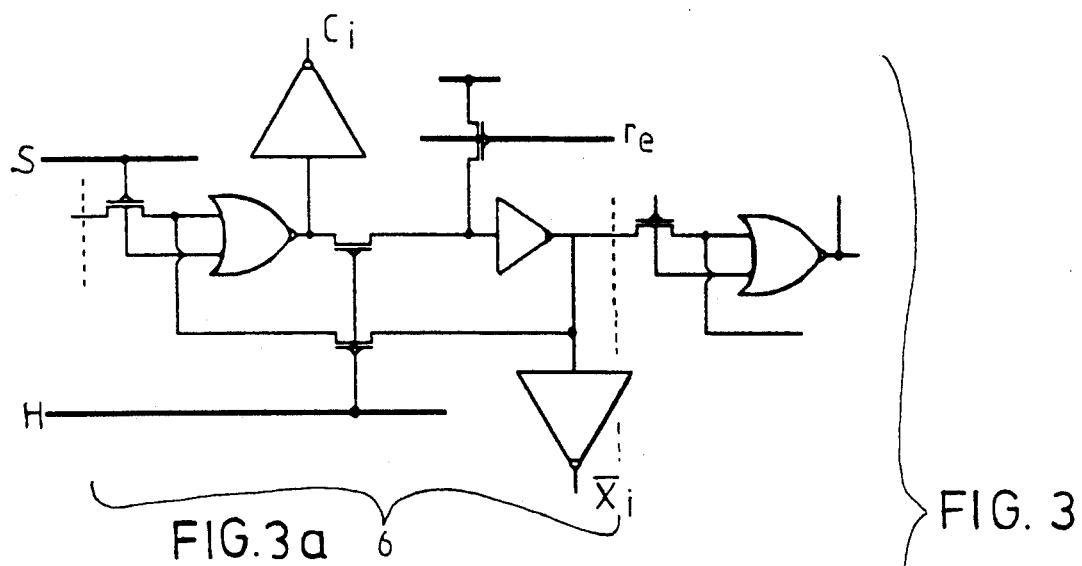
FIG. 3a
FIG. 3
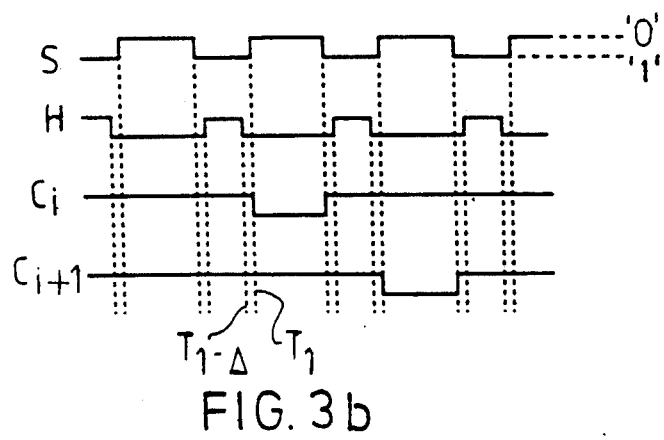
FIG. 3b

RADIATION-SENSITIVE DETECTOR ARRAY AND PRE-AMPLIFICATION READOUT INTEGRATED CIRCUIT

BACKGROUND OF THE INVENTION

The present invention relates to a device for detection of radiation of the type comprising an array of radiation-sensitive elements and means for reading from the radiation-sensitive elements.

In an article in IEEE Transactions on Nuclear Science Volume NS 32, Nr. 1 February 1988 (New York, U.S.): entitled "Integration of Detector Arrays and Read Out Electronics on a Single Chip", authored by B. J. Hosticka et al it is suggested to integrate a detector with read out electronics.

Also, DE-A-3706252 points in the direction of integration of radiation sensitive elements and reading out means.

SUMMARY OF THE INVENTION

It is an object of the present invention to improve upon the above-noted prior art.

It is a further object of the present invention to provide a detection device suited for detecting high energy radiation, e.g. α particles, occurring in high energy collision experiments.

It is another object of the present invention to provide a detection device having a substantial data reduction at the output and a corresponding gain in speed relative to a detector according to the prior art, in which all elements or pixels are addressed separately and in which an array or matrix is sequentially scanned.

The present invention relates to a detection device for detecting radiation comprising an array of elements sensitive to radiation and having respective outputs;

means to consecutively activate each of the radiation sensitive elements;

means to generate a trigger signal depending on the occurrence of an amount of radiation above a threshold value, such that the identity of an element which is activated, can be ascertained; and means for reading the respective outputs.

BRIEF DESCRIPTION OF THE DRAWINGS

Further advantages, features and details of the invention will become apparent from reading the following description of a preferred embodiment of the invention, referring to the drawings, in which:

FIG. 3a is circuit diagram showing further details of FIG. 1;

FIG. 3b is a timing diagram for explaining the operation of the circuit of FIG. 3a;

FIG. 4a is circuit diagram showing details of the detection device of FIG. 1;

FIG. 4b is a logic diagram for explaining the operation of the circuit of FIG. 4a; and FIG. 5 is a cross-sectional view of the preferred embodiment of FIG. 1 produced by means of a method according to the present invention.

DETAILED DESCRIPTION OF THE PREFERRED EMBODIMENTS

Figure 1:
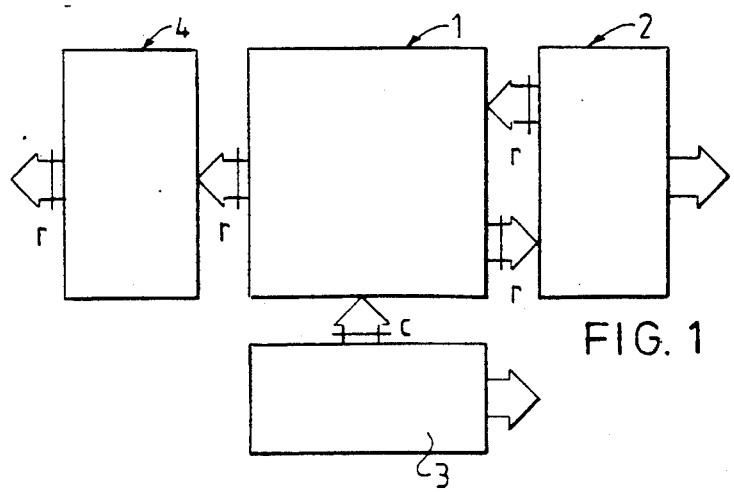
FIG. 1 is a block diagram of a preferred embodiment of the present invention.

A preferred embodiment of the detection device according to the invention (FIG. 1) comprises a matrix 1 of $r \times c$, e.g. $10 \times 10$ radiation-sensitive elements, on intervals of 100 um—complete dimension e.g. $\pm 1$ mm$^2$—, a trigger circuit 2 connected to each row r of radiation sensitive elements; a generator circuit 3 for generating column addresses; and analog amplifiers 4 for amplifying analog output signals when a radiation-sensitive element is activated.

The detection device 1 according to the present invention to be described below, is fast, has a high position resolution, is easy to produce and is simple in design.

The integrated circuit of FIG. 1 is preferably realized by a 3 um-p-well-CMOS process As may be known to one skilled in the art, also other processes, which may for example provide different dimensions, can be used. High resistivity silicon is used for the application in which high energy particles are detected.

In the region of the elements, diodes having a low potential should be avoided, also avoiding relatively deep wells in this region, as they collect charge To the extent possible, process steps are avoided in which high temperatures occur and in which a plasma is used, so as to maintain a long life cycle for minority carriers. As many etching steps as possible in the process are executed chemically. The drive-in step of the p-well (not shown) in which a higher temperature occurs during a substantial time period, is avoided by realizing the p-well by means of ion implantation and a short annealing step.

In the below mentioned article of Vanstraelen et al., it is found that transistors and other elements using a p-channel on a high resistivity substrate have a number of advantageous features, of which an important one relates to the fact that a displacement of the threshold voltage can be neglected when applying a bias voltage to the substrate, e.g. between 0 volts and a voltage at which the substrate is completely depleted.

Figure 2:
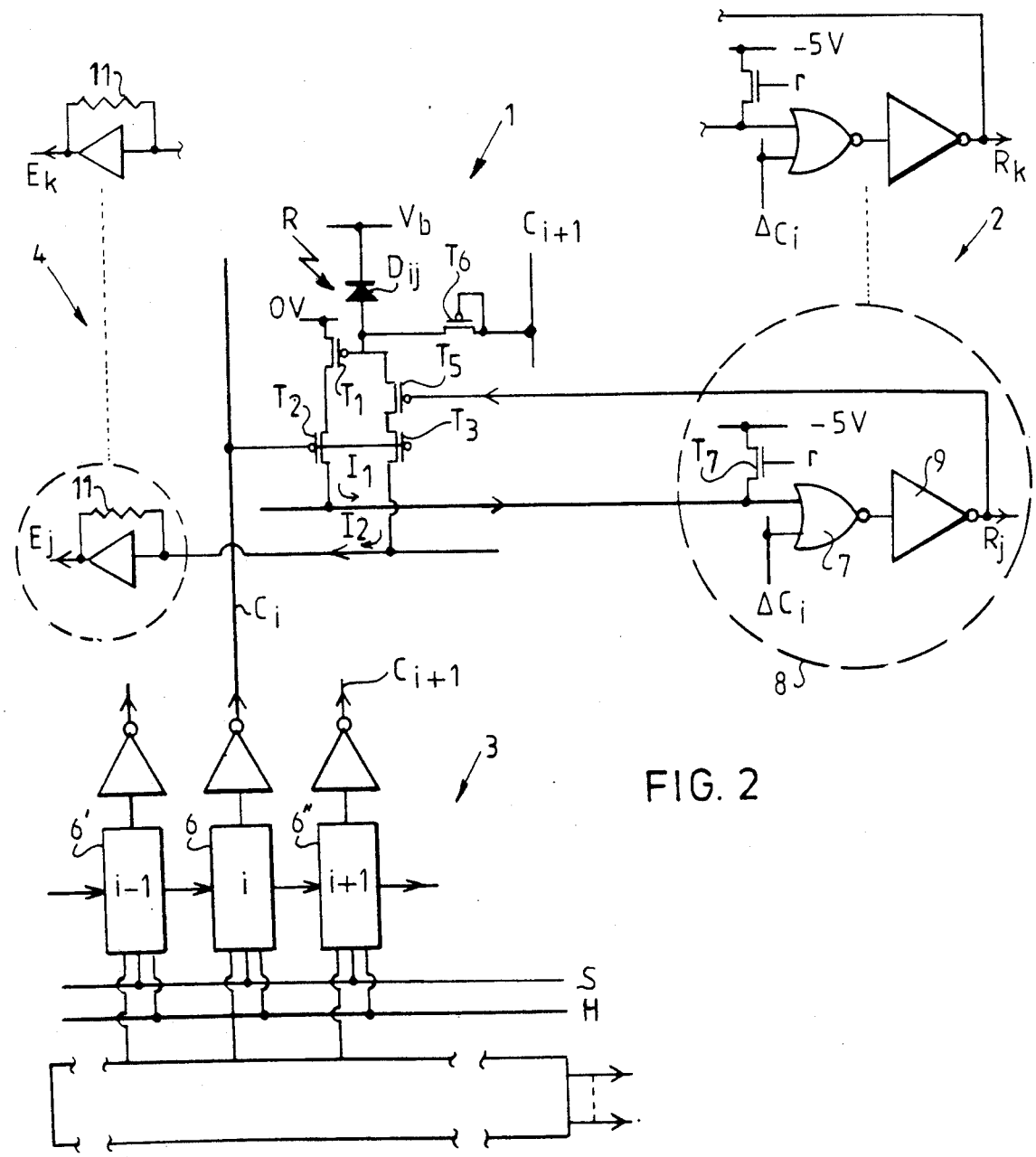
FIG. 2 is a circuit diagram showing details of the preferred embodiment of FIG. 1.

In FIG. 2 one radiation sensitive element, a diode $D_{ij}$ with a capacitance of 0.7 fF and an area of $100 \times 100$ (um)$^2$ is located in the column and jth row and shown in more detail below. The other, e.g. 99, diodes (not shown) are connected in the same manner as diode $D_{ij}$.

In FIG. 2 an amount of charge is stored on the gate of a field effect transistor $T_1$ if radiation R impinges on diode $D_{ij}$ connected to a supply voltage $V_b$ until such time as a shift register element 6, activated by a signal, supplies a column signal $C_i$ to gates of transistors $T_2$ and $T_3$. When transistors $T_2$ and $T_3$ are gated by column signal $C_i$, transistor $T_1$ is switched open, which controls a trigger element 8 from the trigger circuit 2 (FIG. 1). A current $I_1$ controlled by the charge present on the gate of FET $T_1$ is supplied to a NOR circuit 7, to which also a signal $\Delta C_i$ is supplied as a reading signal, delayed relative to signal $C_i$. The signal coming from NOR gate 7 is inverted by inverter 9 and a trigger signal $R_j$ is therefore available, which indicates that in that particular row a diode $D_{ij}$ is activated. The signal $R_j$ is also fed back to the gate of a FET $T_5$ whereby the charge present on the gate of the FET $T_1$ can flow to an amplifying element 11 of the amplifier 4, and whereby the amplified signal $E_j$ is also available. The trigger element 8 is further provided with a FET $T_7$ to the gate of which a signal r is to be applied, such that the trigger element 8 is reset to its starting position. Signal S applied to shift register element 6 may be the same as signal r. The column signal $C_{i+1}$ derived from shift register element 6" resets element 1 through switching transistor $T_6$.

The degree of sensitivity to radiation of element $D_{ij}$ is set by adjusting the value $V_b$ as well as by adjusting the duration of the delay of signal $\Delta C_1$ relative to signal $C_1$.

The generator circuit 3 comprises, as shown in FIG. 2, a shift register made from elements 6; 6' and 6" with which the different columns of the pixel matrix 1 are consecutively controlled. A trigger signal $R_j \ldots R_k$ is available at each row element of the column; at the same time the detected value of radiation is amplified to provide respective signals $E_j \ldots E_k$. At each column a radiation value is read out only from that element upon which radiation impinges, the other elements not being read out because for those no trigger signal $R_j \ldots R_k$ is produced. A substantial data reduction is thus achieved.

An embodiment of a shift register element 6 completely implemented in CMOS technology is shown in FIG. 3a, in which a shift signal S produces at time $T_1$ the signal $C_i$, after latch signal H has provided the possibility therefor at time $T_{1-\Delta}$. Signal $r_e$ acts as a reset signal.

Figures 4, 4A, 4B:
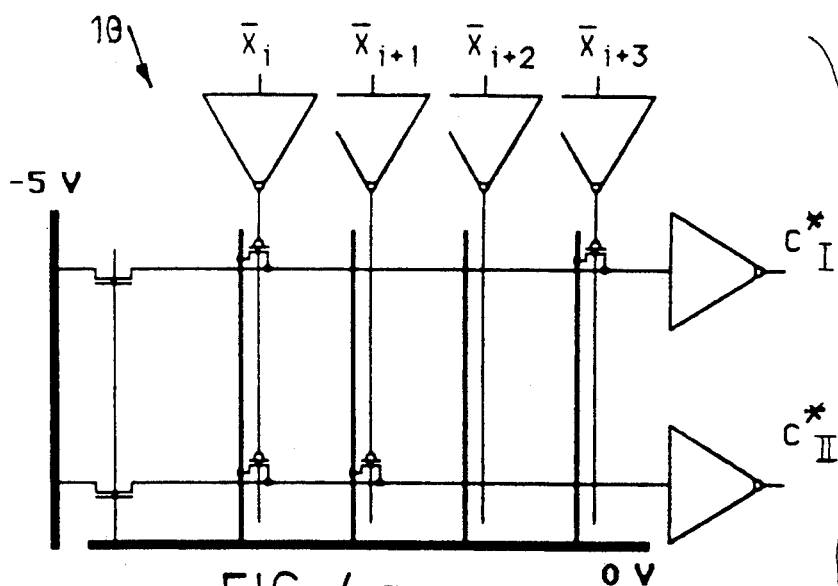

An output at $\overline{X}_i$ of shift register element 6 is supplied to a decoding circuit 10 shown in FIG. 4a for decoding from $2^n$ to N. Circuit 10 is a preferred embodiment integrated in an elegantly simple way. In which circuit 10 the encoding of a four bit signal $(X_i, X_{i+1}, X_{i+2}, X_{i+3})$ to a two bit signal $C^*_I$, $C^*_{II}$ is indicated by the table in FIG. 4b. The conversion takes place by means of a so-called GRAY code requiring only a minimal amount of energy (only one bit at a time is changed).

In connection with the amplifying circuit 4 (FIG. 1), it is noted that current- or voltage-sensitive amplifying circuits are used, contrary to the prior art in which charge sensitive amplifying is used, since transferred characteristics can be made rather independent of the detector capacity constituting the main part of the input capacity. The DC input voltage is made negative so as to attract holes collected in the integrating capacitor. The feed-back resistor 11 of the current-sensitive amplifier (see FIG. 2) is formed by a PMOS transistor on the high resistivity substrate.

The achievable frequency of the mentioned shifting operation and accordingly the frequency of evaluation of the column content is estimated to reach 20 MHz in an embodiment of the invention. The energy dissipation of an embodiment of the detection device according to the present invention of 50×50 elements is 0.5 Watt at a frequency of 15 MHz and at a degree of activation of the rows of 90%.

It is preferred that the detection device according to the present invention (FIG. 5) be realized in a n-Si substrate 14 by means of a CMOS-like structure having a p-well 13 in which structure complementary field effect transistors 15, 16 respectively are disposed The reading out electronics are to be spaced from the detector diodes at the mentioned bias voltage, so that no depleted region is formed therebetween. A lateral field is created by such a depleted region, whereby signal charge would be diverted Only PMOS transistors are allowed in the high resistivity substrate inside the detector region. The other circuits are disposed at a safe distance, e.g. the thickness of the Si chip (in the present case 400 μm). The threshold voltage of the p- and n-channel transistor is made approx 0.5V, e.g. by means of implantation ($V_T$).

Further details of the present invention are disclosed in the article: "Fully Integrated CMOS Pixel Detector for High Energy Particles" of G. Vanstraelen, I. Debusschere, C. Claeys and G. Declerck, published in Nuclear Instruments and Methods in Physics Research, which article was published after the priority date of the present invention.

Although the present invention has been described in connection with a preferred embodiment thereof, many variations and modifications will now become apparent to those skilled in the art. It is preferred, therefore, that the present invention be limited not by the specific disclosure herein, hut only by the appended claims.

I claim:

1. A device for detecting radiation, comprising:
   an array formed of rows and columns of elements sensitive to radiation and having respective outputs;
   enabling means to consecutively enable the columns of radiation sensitive elements;
   trigger means to generate a trigger signal responsive to the occurrence that an element, in a column which has been enabled, has received an amount of radiation above a threshold value, such that the identity of such element can be ascertained; and
   reading means responsive to said trigger signal for reading the respective outputs of only such identified elements.

2. The device of claim 1, wherein the radiation-sensitive elements and the reading means are formed in a monolithic CMOS integrated circuit.

3. The device of claim 2, wherein:
   the radiation-sensitive elements and the reading means are formed on a common, high resistivity substrate; and
   the substrate is arranged to be substantially depleted upon application of a bias voltage between the substrate and the radiation-sensitive elements.

4. The device of claim 2, wherein the monolithic CMOS integrated circuit also includes analog amplifiers for amplifying signals from the outputs of the elements.

5. The device of claim 3, wherein the monolithic CMOS integrated circuit also includes analog amplifiers for amplifying signals from the outputs of the elements.

* * * * *